(12) United States Patent
Nordin et al.

(10) Patent No.: US 11,560,305 B1
(45) Date of Patent: Jan. 24, 2023

(54) MICROFLUIDIC MICROCHIPS BY 3D PRINTING

(71) Applicants: Gregory Nordin, Lindon, UT (US); Adam Woolley, Orem, UT (US); Hua Gong, Meridian, ID (US); Jose Sanchez Noriega, Provo, UT (US); Anna Virginia Bickham, Provo, UT (US)

(72) Inventors: Gregory Nordin, Lindon, UT (US); Adam Woolley, Orem, UT (US); Hua Gong, Meridian, ID (US); Jose Sanchez Noriega, Provo, UT (US); Anna Virginia Bickham, Provo, UT (US)

( * ) Notice: Subject to any disclaimer, the term of this patent is extended or adjusted under 35 U.S.C. 154(b) by 0 days.

(21) Appl. No.: 17/062,536

(22) Filed: Oct. 2, 2020

Related U.S. Application Data

(63) Continuation-in-part of application No. 16/827,547, filed on Mar. 23, 2020, now abandoned, which is a continuation of application No. 16/219,832, filed on Dec. 13, 2018, now Pat. No. 10,597,289, which is a continuation-in-part of application No. 16/034,210, filed on Jul. 12, 2018, now abandoned.

(60) Provisional application No. 62/909,637, filed on Oct. 2, 2019, provisional application No. 62/575,319, filed on Oct. 20, 2017, provisional application No. 62/533,607, filed on Jul. 17, 2017.

(51) Int. Cl.
| | |
|---|---|
| *B33Y 10/00* | (2015.01) |
| *B81C 1/00* | (2006.01) |
| *B33Y 30/00* | (2015.01) |
| *B33Y 70/00* | (2020.01) |
| *B33Y 80/00* | (2015.01) |

(52) U.S. Cl.
CPC ...... *B81C 1/00373* (2013.01); *B81C 1/00119* (2013.01); *B33Y 10/00* (2014.12); *B33Y 30/00* (2014.12); *B33Y 70/00* (2014.12); *B33Y 80/00* (2014.12); *B81C 2201/0185* (2013.01)

(58) Field of Classification Search
CPC ............ B81C 1/00373; B81C 1/00119; B81C 2201/0185; B33Y 10/00; B33Y 30/00; B33Y 70/00; B33Y 80/00
See application file for complete search history.

(56) References Cited

U.S. PATENT DOCUMENTS

2014/0113366 A1* 4/2014 Dahan ................ G01N 33/5008
435/309.1

* cited by examiner

*Primary Examiner* — Elias Ullah
(74) *Attorney, Agent, or Firm* — James Sonntag (57) ABSTRACT

Function fabrication in a microfluidic device manufactured with a custom 3D printer. The functions may include, for example, transporting or routing fluid, fluid mixing through flow and/or diffusion, blocking fluid (valve), pumping fluid, providing chemical reaction regions, providing analyte capture regions, and providing analyte separation regions. The fluid may be a liquid or a gas.

20 Claims, 10 Drawing Sheets

FIG. 16

MICROFLUIDIC MICROCHIPS BY 3D PRINTING

CROSS REFERENCE TO RELATED APPLICATIONS

This application is a continuation-in-part to U.S. patent application Ser. No. 16/827,547, filed Mar. 23, 2020, which is a continuation of Ser. No. 16/219,832, filed Dec. 13, 2018 (now U.S. Pat. No. 10,597,289) which is a continuation-in-part to U.S. patent application Ser. No. 16/034,210, filed Jul. 12, 2018, which claims priority from U.S. Provisional Patent Application 62/575,319, filed Oct. 20, 2017, and from U.S. Provisional Patent Application 62/533,607, filed Jul. 17, 2017, all of which are hereby incorporated by reference.

This application claims priority from U.S. Provisional Patent Application 62/909,637, filed Oct. 2, 2019, which is hereby incorporated by reference.

FEDERAL SUPPORT

This invention was made with government support under Grant Numbers EB006124, EB027096 and GM123405 awarded by the National Institutes of Health. The government has certain rights in the invention.

BACKGROUND

There is great interest in 3D printing for microfluidic device fabrication where feature size is in the truly microfluidic regime (<100 µm).

SUMMARY

As used herein and in the claims, the term "microfluidic", as used to describe a device, channel, fluid portal and the like, is defined as having fluid passages dimensioned less than 100 µm. This refers, for example, to channels having any cross-section dimension less than 100 µm, or a fluid portal in a surface with any dimension less than 100 µm.

The present disclosure involves 3D printing where a microfluidic device with various features is formed layer by layer by applying a layer of uncured resin and curing to crosslink the layer by exposure to UV light from a patterned UV source.

Disclosed in U.S. Pat. No. 10,597,289, to Woolley et al (Woolley) is a method for forming a microfluidic device that regulates exposure of the light to layers underlying the layer being cured. The UV light penetrates for cure the upper layer, but is blocked for lower layers that may deliberately have uncured resin regions for forming voids. A method for manufacturing a microfluidic device is disclosed where the resin of the layers includes a UV light absorber having an absorption spectrum that fully overlaps the spectrum of the UV source. This results in little or essentially no exposure of underlying layers to the UV and preserves any pattern of cured/uncured resin in those layers. Using a custom Digital Light Processor stereolithographic (DLP-SLA) 3D printer and a specifically-designed, low cost, custom resin it was shown that flow channel cross sections as small as 18 µm×20 µm can be produced. The 3D printer has a projected image plane resolution of 7.6 µm and uses a 385 nm LED, which dramatically increases the available selection of UV absorbers for resin formulation compared to 3D printers with 405 nm LEDs. Beginning with 20 candidate absorbers, demonstrated was the evaluation criteria and process flow required to develop a high-resolution resin. In doing so, a new mathematical model for characterizing the resin optical penetration depth based only on measurement of the absorber's molar absorptivity was introduced. The final resin formulation uses 2-nitrophenyl phenyl sulfide (NPS) as the UV absorber.

An advantage of the system demonstrated in Woolley is the ability to construct microfluidic structures, such as channels and voids with walls of higher definition, and resolution. This was achieved in part by a novel channel narrowing or wall definition technique that, together with the resin and 3D printer resolution, enables small flow channel fabrication. This technique involved selectively increasing UV exposure of resin near the wall, thus increasing cross-linking at the wall. The efficacy of this approach was demonstrated by fabricating well defined and narrow 3D serpentine flow channels 41 mm long in a volume of only 0.12 $mm^3$, and by printing high aspect ratio flow channels 13 µm wide and 3 mm tall. This showed the suitability of 3D printing for microfluidic device prototyping and fabrication.

In this disclosure, construction of microfluidic structures is further demonstrated using 3D printing. The above wall definition technique using different exposure times (i.e., optical dose) for different pixels in individual layers (accomplished by using multiple images to expose each layer) is used to create new features.

An additional technique for improved void and channel construction is to locally change the layer thickness. This can be used, for example, for channel side walls, particularly when smooth sidewalls are desired. It can also be used to create features that would be otherwise impossible, such as fabrication of the small membrane valve described below.

Also described herein is the fabrication of new features in a microfluidic device using the above channel fabrication systems.

DETAILED DESCRIPTION

A 3D printing system is fully described in Woolley. There was shown that Digital Light Processor stereolithographic (DLP-SLA) 3D printing is fully capable of 3D printing truly microfluidic flow channels with designed cross sectional areas as small as 18 μm×20 μm. The out-of-plane void size is dependent on formulating a resin that adequately limits optical penetration during each layer exposure, which requires that the absorber's absorption spectrum fully cover the source spectrum. Small in-plane (x-y) void size is a function of the projected image resolution with a minimum width of 4 pixels. Also an additional edge dose for each layer containing a flow channel is an effective method of narrowing flow channel width.

In summary, the Woolley method involves manufacturing a microfluidic device by;

(1) constructing the microfluidic device layer by layer by applying a layer of uncured resin and curing to crosslink the layer by exposure to UV light from a UV source, for the exposure of each individual layer;

(2) patterning the exposure of the UV source to expose at least a portion of the layer to cure the resin in that portion and to optionally leave one or more portions unexposed to leave uncured resin in those portions, (3) including in the resin of the layer a UV light absorber having an absorption spectrum that fully overlaps the spectrum of the UV source to result in a spectral overlap.

The thickness of the layer is sufficiently small, and the exposure to UV light is of a duration to crosslink resin in the exposed portions of the layer corresponding to the exposure pattern. UV light does not penetrate to layers underlying the layer sufficient to cure uncured resin portions in the underlying layers due to the UV light absorber.

Finally uncured resin is flushed from the unexposed portions of the constructed layered microfluidic device to result in a microfluidic device with voids. The voids are interconnected to function as microfluidic components.

Each layer can be exposed to UV light by multiple successive exposures, each exposure patterned to result in a layer with cured portions having a different degree of crosslinking in the layer. The different degree of crosslinking can be higher crosslinking adjacent to uncured portions to better define the wall of voids in the final microfluidic device.

The Woolley method can be also described as a method of manufacturing a microfluidic device that comprises constructing the microfluidic device layer by layer by applying a layer of uncured resin and curing to crosslink the layer by exposure to UV light from a UV source for UV exposure of each individual layer. The exposure of each layer involves multiple exposures, with each exposure patterned by the UV source to expose at least a portion of the layer to cure the resin in that portion. Optionally one or more portions are left unexposed to not cure resin in those portions. The exposure patterns of the multiple exposures are designed to result in a layer with any combination of cured portions with a different degree of crosslinking, and uncured portions.

The thickness of a layer is sufficiently small, and the exposure to UV light of a time, to crosslink resin in the exposed portions of the layer corresponding to the exposure pattern, UV from the exposed layer does not penetrate to any underlying layer enough to result in significant curing or crosslinking of underlying layers, thus substantially preventing the underlying layer from curing. The UV light penetrates with an exponentially decaying dependence on distance into the resin and already-fabricated layers. The key is that the exponential tail is kept small enough to avoid substantial polymerization in underlying layers.

Uncured resin is then flushed from the unexposed uncured portions of the layered microfluidic device to result in a microfluidic device with voids corresponding to the uncured portions in the layers. The voids are interconnected to function as microfluidic components.

The dose of UV light can be adjusted during exposure for each individual layer by selecting duration of each exposure, pattern of each exposure, and number of exposures such that any area or region in the individual layer can have a different UV dose, and consequently, a different degree of crosslinking of resin from other areas.

The resin may contain a UV light absorber having an absorption spectrum that fully overlaps the spectrum of the UV source to result in a spectral overlap. The UV light absorber may include 2-nitrophenyl phenyl sulfide (NPS) and the UV source may have a wavelength of 385 nm.

Using the Woolley method various functions may be constructed in the microfluidic chip, including for example, transporting or routing fluid, fluid mixing through flow and/or diffusion, blocking fluid (valve), pumping fluid, chemical reaction regions, analyte capture regions, and analyte separation regions. The fluid may be a liquid or a gas.

Wall Definition Technique (WDT)

The area immediately adjacent to an uncured area has higher or lower dose than other areas on the layer, and can correspond in the microfluidic device to a void or channel wall that is adjacent to the void (such as a channel). A different degree of crosslinking can include higher crosslinking adjacent to uncured portions to better define the wall of voids in the final microfluidic device.

Variable Layer Technique (VLT)

Desired features can be fabricated using the above WDT with different exposure times (i.e., optical dose) for different pixels in individual layers (accomplished by using multiple images to expose each layer), but also by VLT where there is locally a changing of the layer thickness. Both of these techniques can be used, depending on the application, alone, or in combination together. The two techniques may also be interchangeable where similar features may be constructed by either technique. Either technique can be used in any region where, compared to the bulk, more or less crosslinking is required.

EXAMPLES

Channel Walls Definition Using VLT

Figure 1:
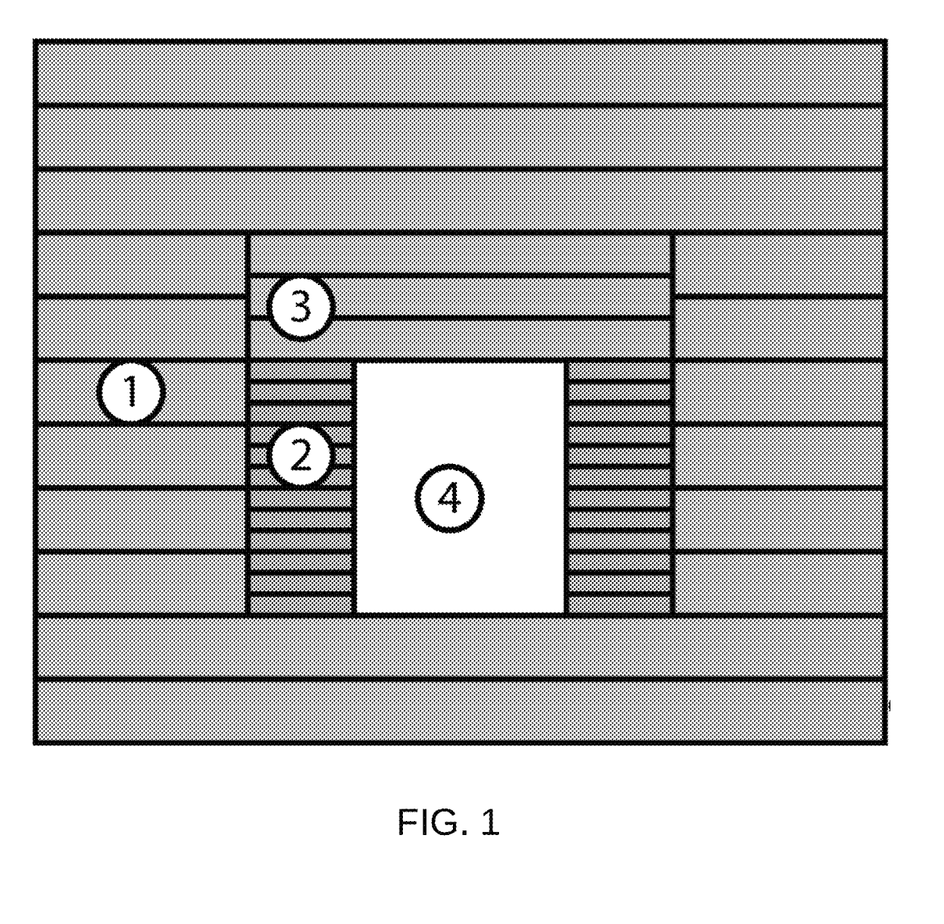
FIG. 1. Cross section schematic of channel (4) with different layer thicknesses and exposure times next to (2) and above (3) the channel compared to the bulk region (1).

An example of the variable layer technique is shown in together FIG. 1. in which the layer thicknesses and exposures next to and above a channel (Regions 2 & 3, respectively) are different from those in the bulk (Region 1). This can be an attractive option when smooth channel sidewalls are required, as seen by comparing the SEM images in FIGS.

Figure 2A:
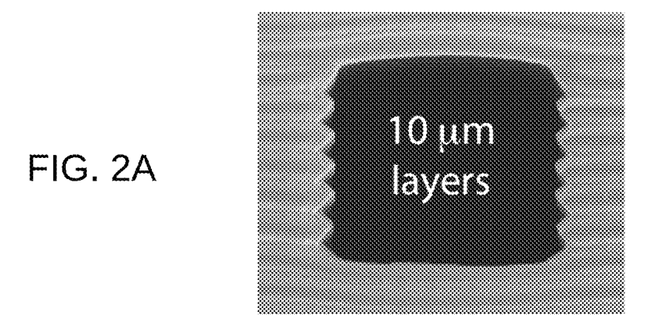
FIGS. 2A, 2B, 2C and 2D. Views showing effect of layer thickness on channel side-wall scalloping.
Figure 2B:
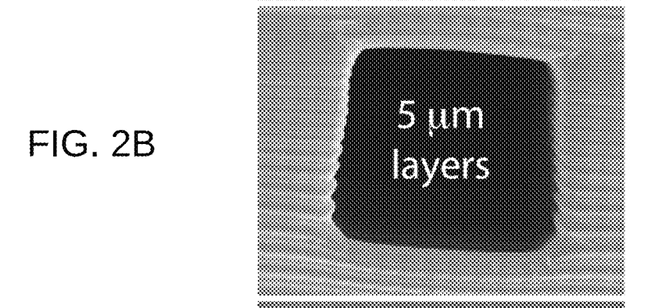
Figure 2C:
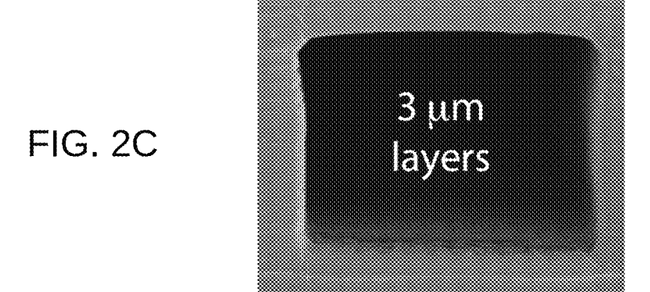
Figure 2D:
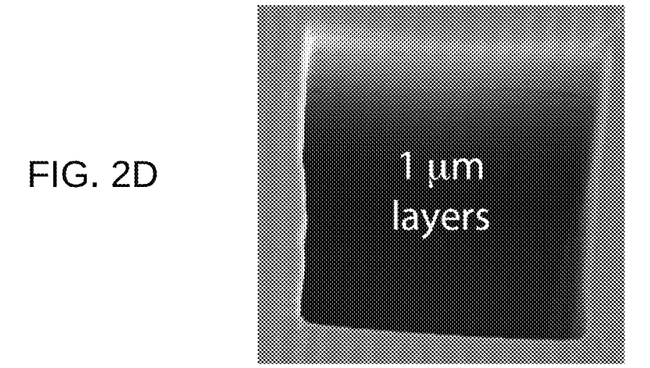

2A to 2D. Multiple layers of different thickness can be stacked to form, for example, reinforced walls, as shown in Regions 2 and 3, and may optionally be crosslinked or cured to lesser or greater degree than the bulk.

Also as illustrated in FIG. 1, the UV dose in a finite number of layers (Region 3) above a void region (Region 4) can be used to enable smaller void region heights. During fabrication, these layers above reduce the exponential light tail from UV doses being applied above for newly curing layers, reducing or substantially eliminating unwanted polymerization of uncured resin in Region 4.

Membrane Valve Using VLT

Figure 3A:
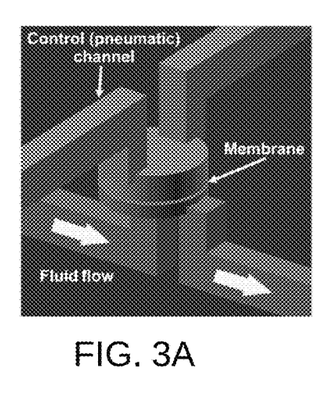
FIGS. 3A, 3B, 3C. A perspective view showing construction and operation of a microfluidic micro valve.
Figure 3B:
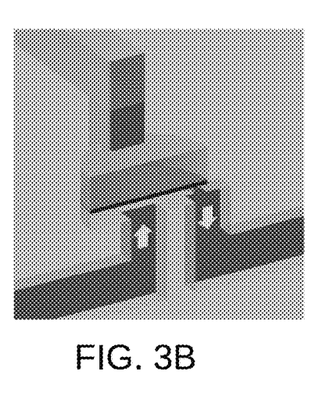
Figure 3C:
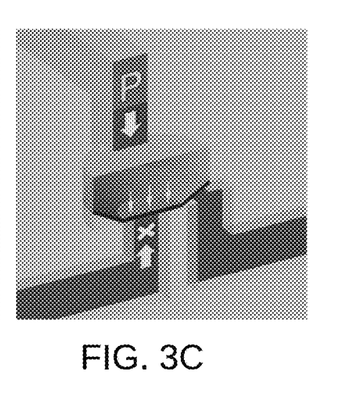

Another example is shown in FIGS. 3A to 3C for the case of a small membrane valve. FIGS. 3A, 3B and 3C show the basic idea of a membrane valve. A space for the valve is bisected by a membrane that is part of the 3D print, which is formed by a thin layer between thicker layers that form upper and lower voids above and below the thin layer. When the upper chamber is pressurized, the membrane is deflected and blocks access between the two channels connected to the lower chamber, thereby closing the valve. When pressure in the upper chamber is released (or vacuum is pulled) the membrane moves up, thereby opening the valve. The figure shows a circular membrane. However, the membrane may be any shape (circular, square, rectangular, star, or any arbitrary shape).

Figure 4A:
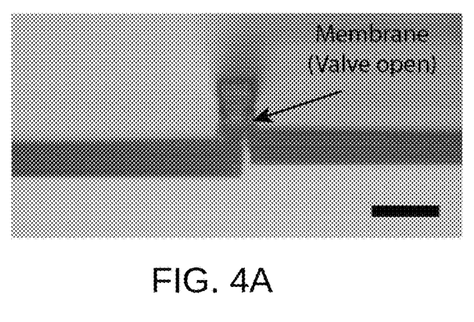
FIGS. 4A and 4B.—Side view microscope images showing operation of microfluidic valves. Scale bars in the microscope images are 100 microns.
Figure 4B:
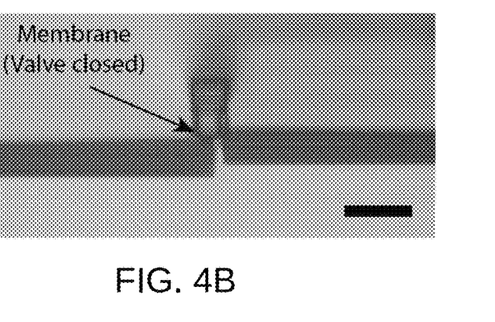

FIGS. 4A and 4B show a 3D printed 6 pixel (46 micron) diameter valve in open and closed states, respectively.

Figure 5:
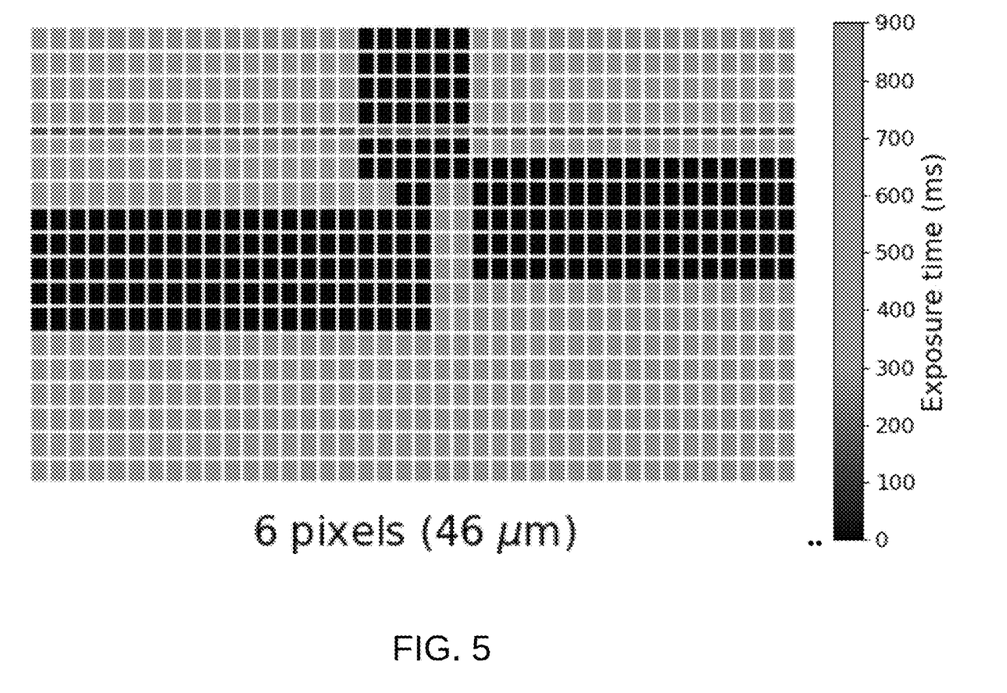
FIG. 5. A diagram of sectional slice that shows how the valve was fabricated in terms of layer thicknesses and exposure times.

FIG. 5 shows a sectional slice that shows how the valve was fabricated in terms of layer thicknesses and exposure times. The diagram indicates layers in the vertical direction (regions between white horizontal lines) and pixels in the horizontal direction (regions between white vertical lines). All of the pixels are 7.6 microns wide. Most of the layers are 10 microns thick, with several exceptions such as the membrane layer (4 microns thick) and the layer just below the membrane layer (6 microns thick). The color scale bar on the right shows the exposure time (optical dose) for every pixel in every layer. The varying exposure times and layer thicknesses are chosen to get this component geometry to successfully 3D print and be functional as a valve. Without the ability of changing the layer thickness and the pixel dose on an individual layer and pixel basis, it would not be possible to fabricate this valve structure.

Also, membranes have been formed in the vertical direction out of multiple layers so that the valve is rotated 90 degrees into a vertical orientation compared to FIGS. 3A to 4C, above.

In a similar fashion several features on a microfluidic chip can be fabricated. In particular, using different layer thicknesses and selected optical dose for each layer dose to control cross-linking, a pressure activated feature, a feature requiring void separations by a thin flexible membrane, or any like structure can be fabricated. Such features may include a thin membrane structure where two fluids of different property (e.g. pressure, chemical, temperature) are adjacent to each other but not mixed.

As illustrated in FIG. 5, a microfluidic device can be described as an array of pixels. The microfluidic device is a three dimensional array of pixels or pixel regions, where pixel regions in a horizontal plane correspond to a layer applied during fabrication, and pixel regions in the vertical direction result from layers being applied over each other. As described, by applying in several layers and with different crosslinked regions in each layer, it is possible to predetermine the extent of polymerization or crosslinking in each pixel region, where ever it may occur in the array. This allows for great flexibility in determining localized resin properties and the design of channels or voids where polymerization is nonexistent or essentially avoided. The pixel regions in any horizontal or vertical plane may also have different dimensions, determined, for example, by controlling the thickness of the layers and/or the precision of the 3D printer.

Integrated Serial Dilution Device

Using the system of Woolley, optionally with WDT and/or VLT, a 3D printed microfluidics device that implements a serial dilution operation was fabricated.

A serial dilution consists of starting with a particular analyte concentration, and diluting it by equal factors a number of times to get a series of dilutions. If the dilution factor is 2, then the dilutions go as ½, ¼, ⅛, ¹⁄₁₆, ¹⁄₃₂, etc.

Serial dilutions are ubiquitous in medicine, chemistry, and biology, and are often used to obtain dose-response curves in areas such as drug discovery. Here a microfluidic chip creates a serial dilution directly on-chip such that each dilution can be immediately used on-chip to simultaneously obtain dose-response and other measurements for a wide variety of medical, chemical, and biological applications. Demonstrated is a 10-fold serial dilution device that covers 3 orders of magnitude of concentrations using a dilution factor of 2.

A microfluidic chip has been developed to simultaneously create serial dilutions over a wide range of concentrations and in a manner that all of the outputs are immediately usable for further on-chip processing and measurement for a wide range of applications. The serial dilution microfluidic device provides a continuous flow of each concentration and is suitable for long experimental runs (multi-hour to multi-day).

Foundational Concept

Passive diffusional mixing is used in a tall, narrow channel (it could also be a wide flat channel) in each stage of our serial dilution device to mix equal volumes of the desired reagent and the diluent fluid to achieve a 1:2 dilution ratio.

Figure 6:
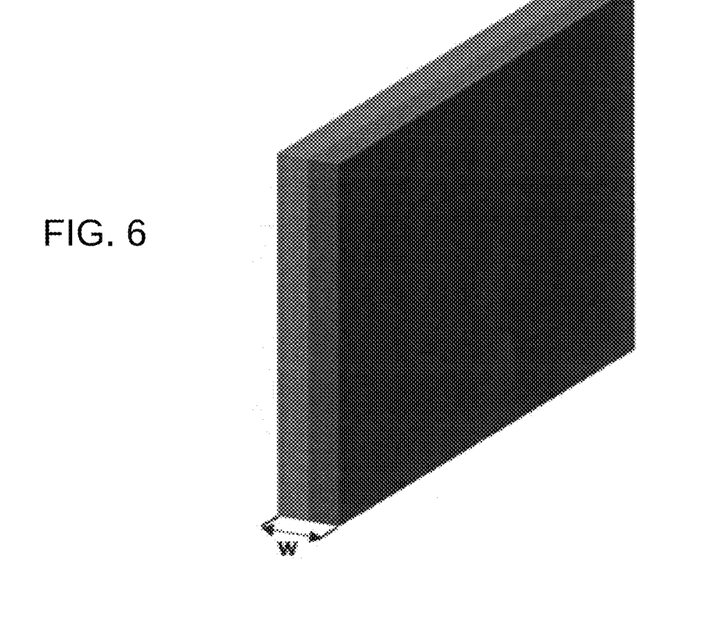
FIG. 6. A diagram illustrating two fluids (red and blue) in contact in a narrow channel.
Figure 7:
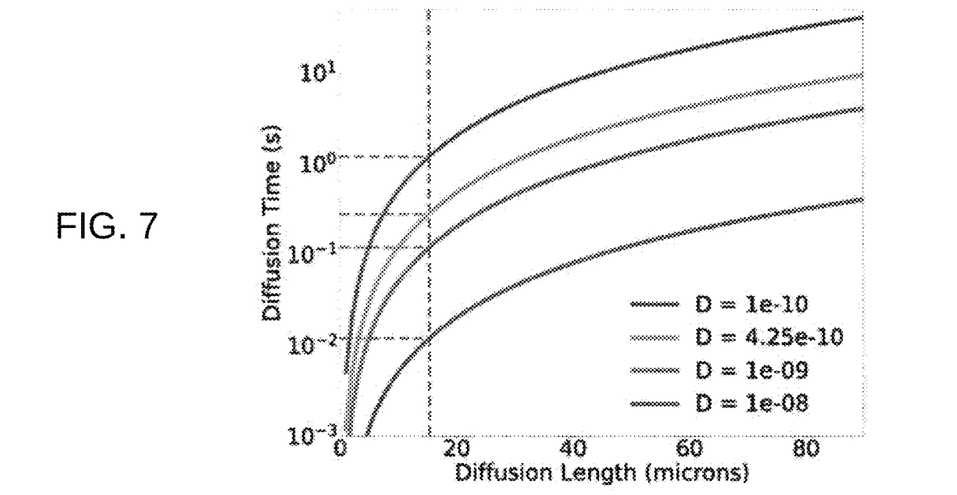
FIG. 7. A graph showing time to diffuse across channel for given diffusion distance parameterized by diffusion constant.

FIG. 6 shows a schematic illustration of a tall, narrow channel with each half filled with different fluids (red and blue). FIG. 7 shows how much time is required to mix the two fluids as a function of the 1D distance over which the fluids must diffuse, which is ½ of the channel width. For example, mixing in a 30 μm wide channel requires diffusion across half of this distance, 15 μm. The plot shows that the diffusion time for typical biological molecules (diffusion constant ~10e-9) is significantly less than a second. Therefore, if the two fluids dwell in the tall narrow channel for a few hundred milliseconds, they will emerge fully mixed.

Single Dilution Mixing Stage

Figure 8:
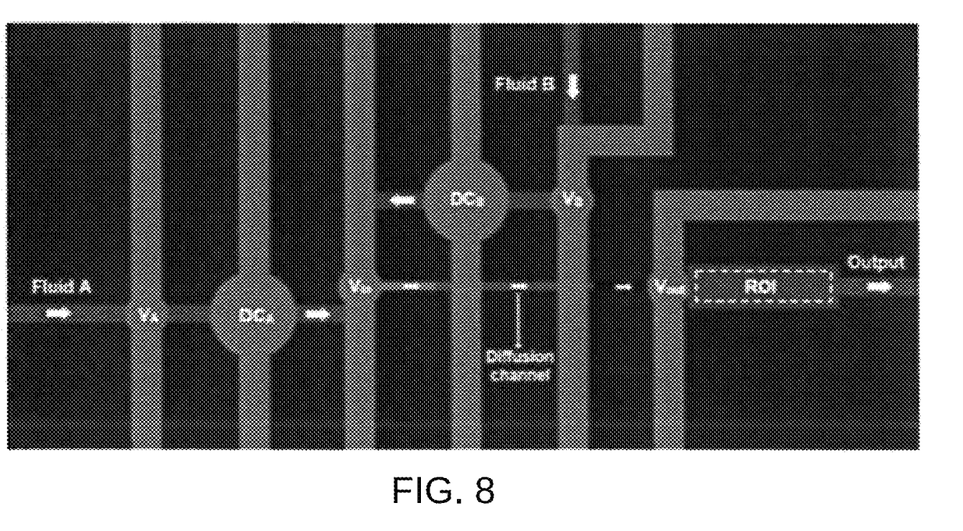
FIG. 8. Top view schematic diagram of single 1-to-2 dilution stage with narrow diffusion mixing channel.
Figure 9:
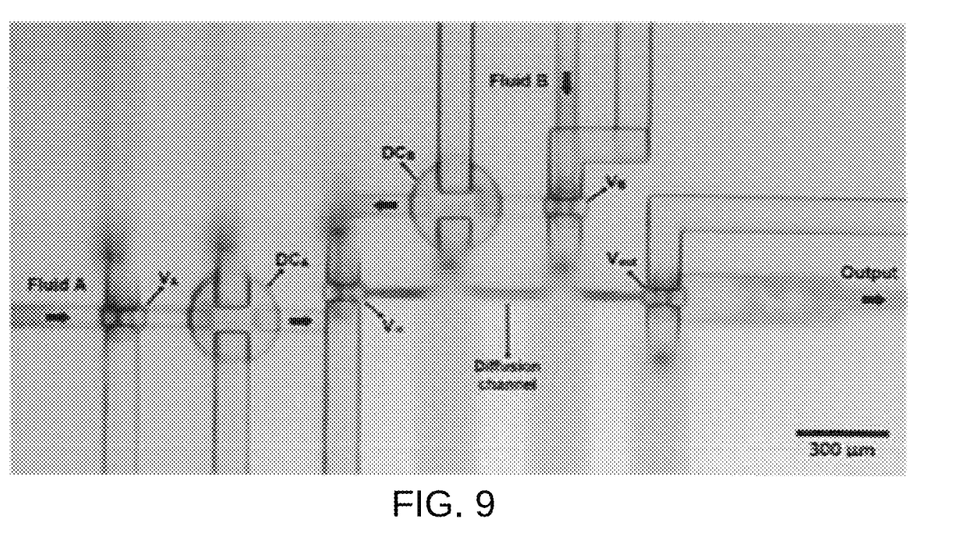
FIG. 9. Microscope photo of fabricated single stage device.

This basic diffusional mixing idea is used in a single dilution mixing stage as shown in FIGS. 8 and 9, which respectively show schematic and microscope top views of two fluid inputs (A and B) with associated 3D printed membrane pumps [1-3] using our 3D printing approach to fabricating microfluidic devices [4-7]. The membrane pumps simultaneously push equal volumes of Fluids A and B into the tall, narrow diffusional mixing channel, which is designed to hold >2× the volume of fluid pushed into it by the two pumps. This results in the fluid dwelling in the tall narrow channel for at least 2 pump cycle times, which are each ~250 ms long. The dwell time is therefore ~500 ms or longer, which is enough time for the fluids to fully mix by diffusion.

Figure 10:
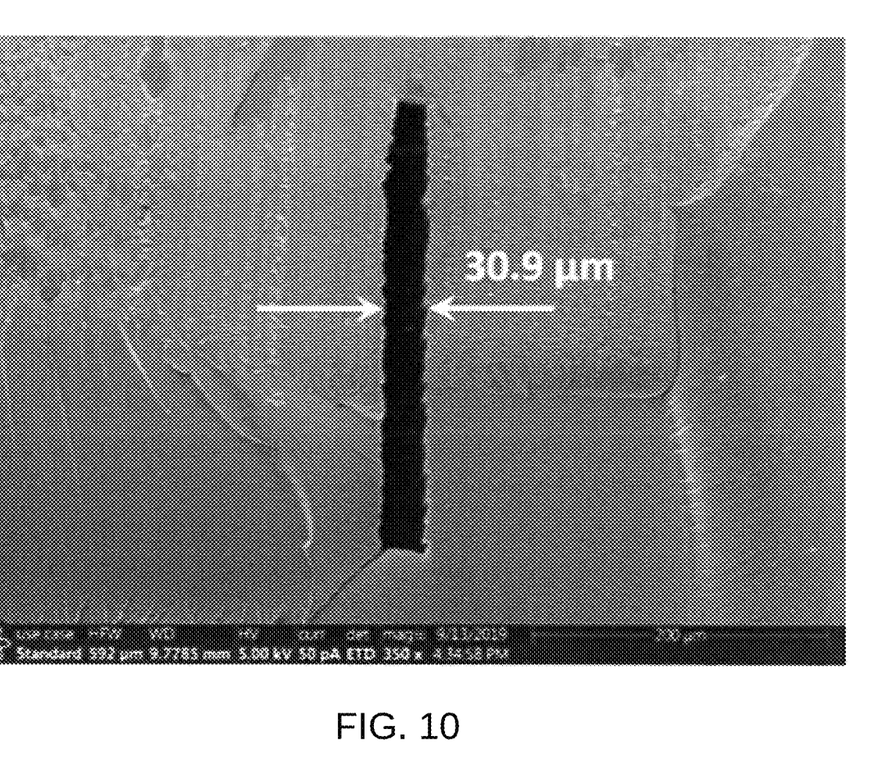
FIG. 10. Scanning electron microscope (SEM) image of narrow mixing channel.
Figure 11:
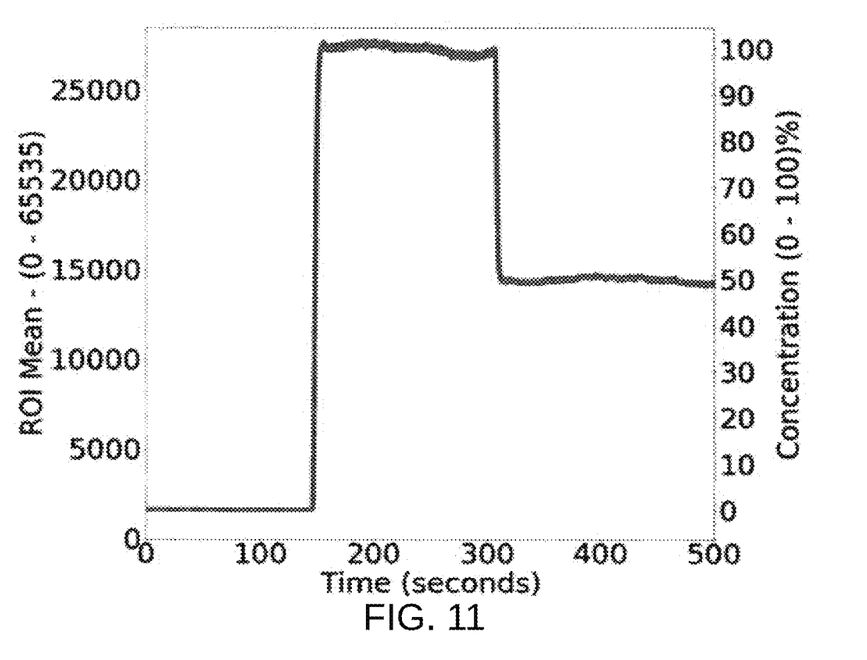
FIG. 11. Graph showing concentration (right vertical axis) as a function of time going from water to full dye concentration to 50:50 mixing.
Figure 12:
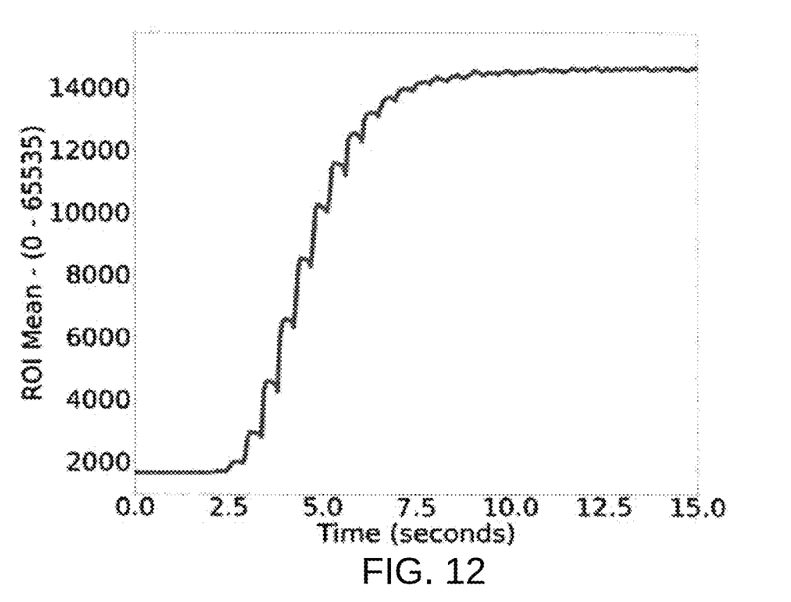
FIG. 12. Graph showing time to reach equilibrium.

FIG. 10 shows a scanning electron microscope (SEM) image of a cross section of a fabricated tall, narrow mixing channel. FIG. 11 shows the concentration (right vertical axis) as a function of time for water, full dye concentration, and a 50:50 mixture of water and dye, the latter being the output during pump operation. This data is used to calibrate the concentration measurement process, which is then used to get the actual concentration during single stage mixer operation. The measured concentration as a function of time is shown in FIG. 12 during start up of the single stage. It takes a little over 5 seconds to reach equilibrium.

10-Stage Serial Dilution Device

Multiple single stages can be arranged serially to generate a serial dilution concentration set by routing one of the two outputs of a given stage to the input of the next stage. The second output is for concentration analysis or experimental use.

Figure 13:
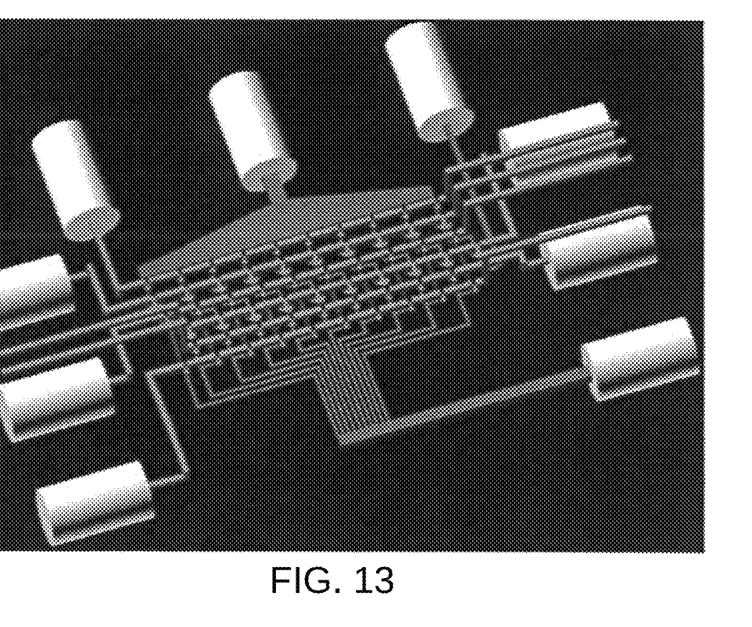
FIG. 13. Schematic image of 10-stage serial dilution device.
Figure 14:
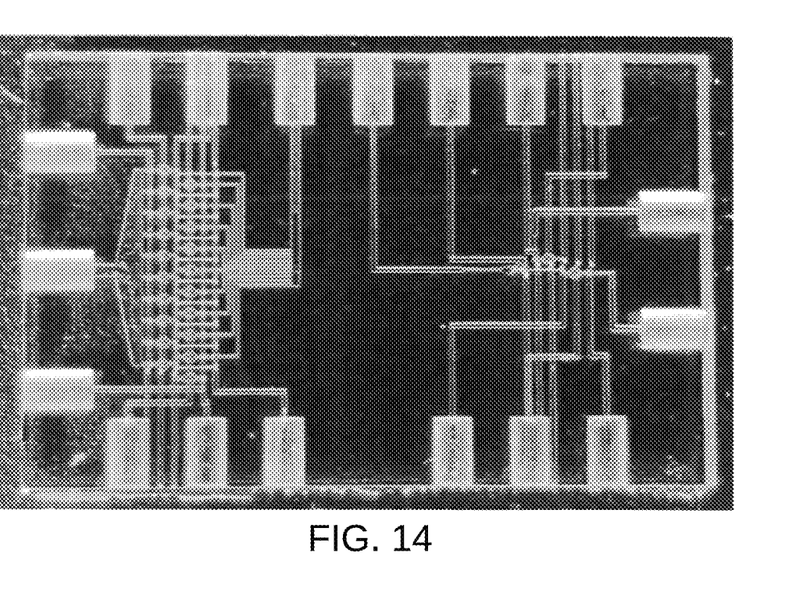
FIG. 14. Photograph of 3D printed serial dilution device. The full chip size is 19 mm wide by 12 mm tall and the serial dilution device occupies only the left third of the chip.

A 10-stage implementation is shown schematically and in a 3D printed chip in FIG. 13 and FIG. 14. In the photo (FIG. 14) of the 3D printed device, only the left third of the chip is occupied by the serial dilution device, leaving the rest of the chip available for other experimental structures to perform arbitrary measurements with the 10 fluid concentrations simultaneously supplied by the serial dilution device. Note that using the techniques illustrated in Reference 8, the volume occupied by the serial dilution device can be further reduced, leaving even more of the chip available for experimental and measurement use. Devices can be made in a similar manner with any number of stages, up to, for example, 30 or 100.

Figure 15:
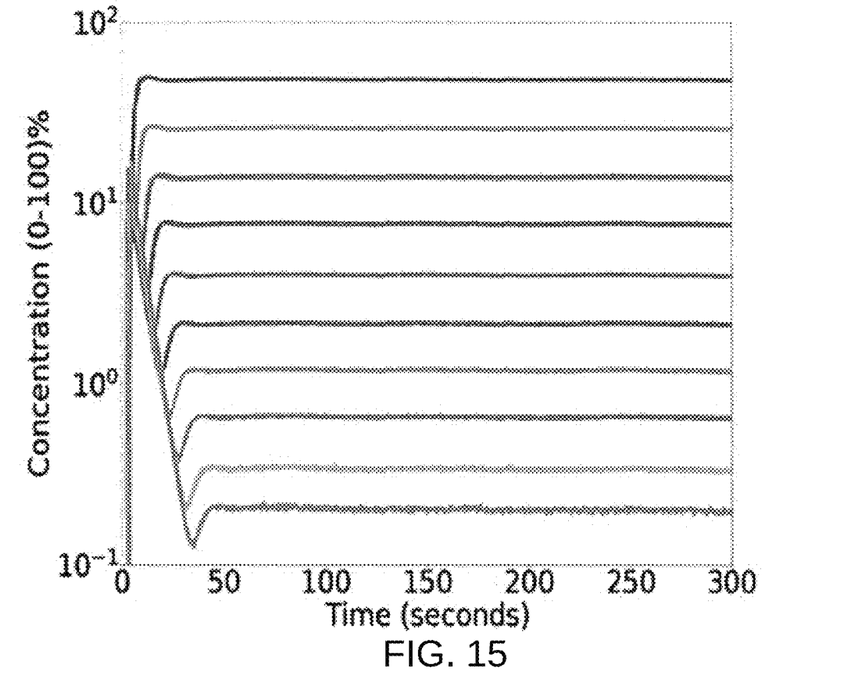
FIG. 15. Graph showing measured concentration in all 10 output channels as a function of time. Equilibrium is reached in less than a minute.
Figure 16:
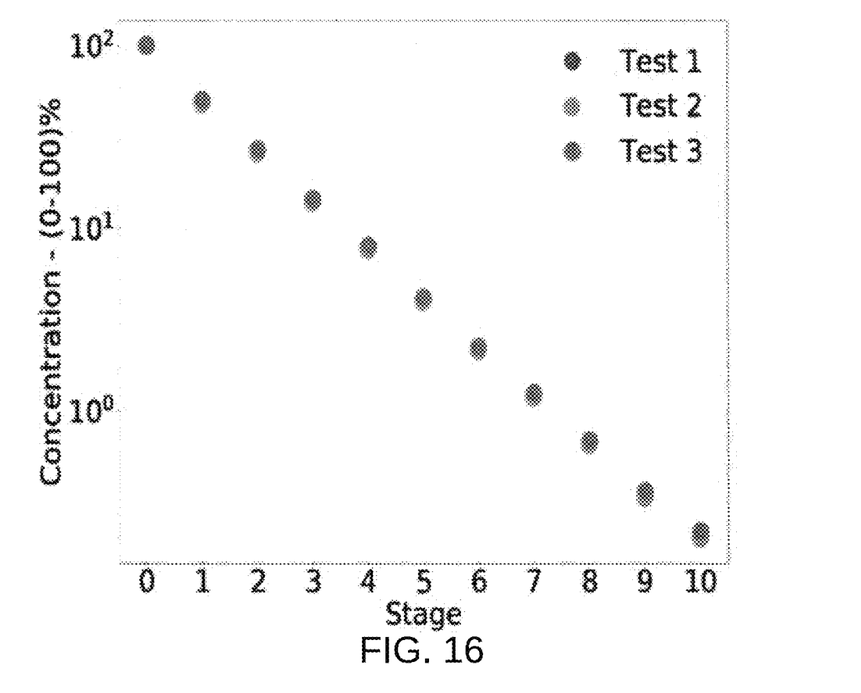
FIG. 16 Graph showing measured concentration as a function of the output stage. Note that the concentration in the outlet channels covers 3 orders of magnitude of concentration, and that 3 replications show that the concentration outputs are repeatable.

FIG. 15 and FIG. 16 show concentration measurements from a 3D printed serial dilution device during device operation. The graph in FIG. 15 shows the concentration in the 10 outputs as a function of time during start up of the device. Full equilibrium for all of the outputs is reached in less than a minute. The graph in FIG. 16 shows the measured concentrations on a log scale as a function of the stage of the output. Note that the expected linear relationship is maintained over 3 orders of magnitude, thereby demonstrating the effectiveness of this approach in generating a 10-stage serial dilution in a 3D printed chip.

These example illustrates how the Woolley method or a like method involving 3D printed layers to fabricate microfluidic devices can be used to create complex microfluidic structures. Like dilution devices can be fabricated with a single stage or any number of desired stages. Also note in the example, the device is truly 3 dimensional with channels above, but not intersecting the narrow diffusion channel. In addition, a channel can travel along a 3D path in and out of different layers. Channels can be created not only in a horizontal x-y plane, but also can extend along a vertical z-axis. Furthermore, a channel or void can be narrowed or expanded along any 3D axis, creating, for example, a thin flat chamber extended along two axes (as illustrated in FIG. 6), a container or chamber that extends widely along all three axes, or a narrow (straw-like) conduit expanded along one axis. In addition, conduits, chambers, and the like can have a complex three-dimensional shape.

TABLE OF REFERENCES

1. Chad I. Rogers, Kamran Qaderi, Adam T. Woolley, and Gregory P. Nordin, "3D Printed Microfluidic Devices with Integrated Valves", Biomicrofluidics 9, 016501 (2015).
2. Hua Gong, Adam T. Woolley, and Gregory P. Nordin, "High density 3D printed microfluidic valves, pumps, and multiplexers," Lab on a Chip, 16(13), pp. 2450-2458 (2016).
3. Hua Gong, Adam T. Woolley, and Gregory P. Nordin, "3D printed high density, reversible, chip-to-chip microfluidic interconnects," Lab on a Chip, 18, 639-647 (2018).
4. Hua Gong, Michael Beauchamp, Steven Perry, Adam T. Woolley, and Gregory P. Nordin, "Optical Approach to Resin Formulation for 3D Printed Microfluidics," RSC Advances, 5, pp. 105521-106632, (2015).
5. Michael J. Beauchamp, Gregory P. Nordin, and Adam T. Woolley, "Moving From Millifliudic to Truly Microfluidic Sub 100 µm Cross-Section 3D Printed Devices," Analytical and Bioanalytical Chemistry 409:4311-4319 (2017).
6. Hua Gong, Bryce Bickham, Adam T. Woolley, and Gregory P. Nordin, "Custom 3D printer and resin for 18 micron×20 micron microfluidic flow channels," Lab on a Chip, 17, 2899-2909 (2017).
7. Michael J. Beauchamp, Hua Gong, Adam T. Woolley, and Gregory P. Nordin, "3D printed microfluidic features using dose control in X, Y, and Z dimensions," Micromachines, 9(7), 326 (2018).
8. Hua Gong, Adam T. Woolley, and Gregory P. Nordin, "3D Printed Selectable Dilution Mixer Pumps," Biomicrofluidics 13, 014106 (2019).

What is claimed is:

1. A microfluidic device comprising,
a structure of photo-cured resin,
the structure of multiple adjacent layers of photo-cured resin with each layer having one or more resin regions of preselected cross-linking
with multiple photo-cured resin layers of the photo-cured adjacent layers having one or more regions containing non-crosslinked resin where there is no crosslinking of resin, resulting in no resin or void regions when non-crosslinked resin is removed, such that void regions within multiple adjacent layers are disposed to provide a three-dimensional network of channels configured for microfluidic function.

2. A device as in claim 1 wherein a wall of a channel is defined by one or more adjacent layers where resin in a second resin region adjacent to the void region defining the channel is crosslinked further or less than the adjacent crosslinked resin region.

3. A device as in claim 1 wherein the at least one layer has one or more regions with the same or different crosslinking to a region of an adjacent layer.

4. A device as in claim 1 wherein at least one layer has a different thickness to other layers in the device.

5. A device as in claim 4 wherein the at least one layer with a different thickness has one or more regions with the same or different crosslinking to a region of other layers in the device.

6. A device as in claim 4 wherein the at least one layer is thinner than overlying adjacent layers on both surfaces and the at least one layer has a cured resin region adjacent to a void region in both of the adjacent layers to provide a flexible membrane between first and second channels provided by the no resin regions.

7. A device as in claim 6 wherein the membrane functions as a membrane pump wherein an oscillating pressure in first channel provides a pumping action in the second channel.

8. A device as in claim 6 wherein the flexible membrane is activated by a change in pressure in the first channel, and the activation switches a function in the second channel.

9. A device as in claim 8 wherein the function in the second channel is switching between blocking the second channel and unblocking the second channel.

10. A device as in claim 9 wherein the function functions by change in pressure in the first channel to selectively extend the membrane into the second channel sufficient to block the second channel and selectively withdrawing the membrane from the second channel to unblock the second channel.

11. A device as in claim 1 wherein a layer on at least one of its two surfaces, has an overlying adjacent layer that does not extend over all of its at least one surface.

12. A device as in claim 11 wherein on its at least one surface has at least two overlying adjacent layers, with at least one of the adjacent layers having a thickness different than other overlying adjacent layers on the at least one surface.

13. A device as in claim 12 wherein the at least one of the overlying adjacent layers is thinner than the other overlying adjacent layers on the at least one surface, and the thinner adjacent layer is duplicated for several new layers forming a stack of thinner layers.

14. A device as in claim 13 wherein a wall of the channel is defined by the stack of thinner layers being adjacent to void regions of the layers.

15. A device as in claim 1 wherein above layers are above a void region, the above layers crosslinked to a degree that during fabrication reduce the UV light from UV doses being applied above for new curing layers to reduce crosslinking to uncured resin in the void region.

16. A device as in claim 1 wherein the device comprises a truly 3D network of interconnecting channels of different functions.

17. A device as in claim 16 wherein a function of a channel is one or more function selected from transporting or routing fluid, fluid mixing through flow and/or diffusion, blocking fluid (valve), pumping fluid, providing chemical reaction regions, providing analyte capture regions, and providing analyte separation regions, where the fluid is a liquid or a gas.

18. A device as in claim 1 having at least one channel for mixing two or more liquids, with a network of channels to transport the liquids to and withdraw the mixed liquids from the at least one channel.

19. A device as in claim 18 wherein the at least one channel for mixing liquids has a dilution function for diluting a first liquid with a second liquid.

20. A device as in claim 19 wherein there are two or more channels for mixing liquid with a dilution function, the two or more channels are interconnected to provide a serial dilution.

* * * * *